United States Patent [19]

Sakamoto

[11] Patent Number: 5,003,200

[45] Date of Patent: Mar. 26, 1991

[54] PROGRAMMABLE LOGIC DEVICE HAVING PROGRAMMABLE WIRING FOR CONNECTING ADJACENT PROGRAMMABLE LOGIC ELEMENTS THROUGH A SINGLE SWITCH STATION

[75] Inventor: Makoto Sakamoto, Chiba, Japan

[73] Assignee: Kawasaki Steel Corporation, Hyogo, Japan

[21] Appl. No.: 408,523

[22] Filed: Sep. 18, 1989

[30] Foreign Application Priority Data

Sep. 20, 1988 [JP] Japan ............................... 63-235293

[51] Int. Cl.$^5$ ....................................... H03K 19/177
[52] U.S. Cl. ............................... 307/465; 340/825.83; 340/825.87
[58] Field of Search ................... 307/465, 468–469, 307/272.2; 340/825.83, 825.85, 825.87–825.91

[56] References Cited

U.S. PATENT DOCUMENTS

| | | | |
|---|---|---|---|
| 4,293,735 | 10/1981 | Duret | 340/825.89 X |
| 4,642,487 | 2/1987 | Carter | 307/465 |
| 4,670,749 | 6/1987 | Freeman | 307/465 X |
| 4,758,745 | 7/1988 | El Gamal et al. | 307/468 X |
| 4,786,904 | 11/1988 | Graham, III et al. | 307/465 X |
| 4,857,774 | 8/1989 | El-Ayat et al. | 307/465 |

FOREIGN PATENT DOCUMENTS 0177261 9/1985 European Pat. Off. .
0204034 12/1986 European Pat. Off. .

OTHER PUBLICATIONS

Electro/87 and Mini/Micro Northeast, vol. 12, 1987.
Journal of the Association of Computing Machinery, vol. 14, No. 2.

Primary Examiner—David Hudspeth
Attorney, Agent, or Firm—Oliff & Berridge

[57] ABSTRACT

There is provided a programmable logic device (PLD) which includes a programmable wiring, the programmable wiring comprising: a plurality of switch stations (SS), first wirings each for directly connecting some terminals among input/output terminals of said SSs to input/output terminals of adjacent programmable logic elements (PLE), and second wirings each for directly connecting some terminals among the input/output terminals of said SSs to input/output terminals of the adjacent SS. Hereby, the numbers of involved switches, through which associated signals pass, can be reduced.

5 Claims, 6 Drawing Sheets

FIG. 7

|    | A | B | C | CK | X | Q | N1 | N2 | S1 | S2 | W | E |
|----|---|---|---|----|----|----|----|----|----|----|----|----|
| A  | ///| ///| ///| ///| 1 | 1 | 1  |    | 1  |    |    |    |
| B  | ///| ///| ///| ///|   | 1 |    |    | 1  |    | 1  |    |
| C  | ///| ///| ///| ///| 1 | 1 |    | 1  |    | 1  | 1  | 1  |
| CK | ///| ///| ///| ///| 1 |   |    |    |    |    | 1  | 1  |
| X  | 1 |   | 1 | 1  | ///| 1 |    | 1  |    | 1  | 1  | 1  |
| Q  |   | 1 | 1 |    | ///| ///|    | 1  |    | 1  | 1  | 1  |
| N1 | 1 |   |   |    | 1 |   | ///| 1  |    | 1  |    |    |
| N2 |   | 1 |   |    | 1 |   | ///| ///| 1  |    |    | 1  |
| S1 | 1 |   |   |    | 1 |   | 1  |    | ///| 1  |    |    |
| S2 |   | 1 | 1 |    | 1 |   |    | 1  | ///| ///|    | 1  |
| W  | 1 |   | 1 | 1  | 1 | 1 |    |    | 1  | ///| ///| 1  |
| E  |   | 1 | 1 | 1  | 1 | 1 |    |    |    | 1  | ///| ///|

1 --- WITH SWITCH

PROGRAMMABLE LOGIC DEVICE HAVING PROGRAMMABLE WIRING FOR CONNECTING ADJACENT PROGRAMMABLE LOGIC ELEMENTS THROUGH A SINGLE SWITCH STATION

BACKGROUND OF THE INVENTION

1. Field of the Invention

The present invention relates to a programmable logic device which permits a user to electrically program an arbitrary logic circuit manually, and more specifically to an improved programmable logic device, which includes highly versatile, or functional programmable wiring occupying a reduced area for connecting a plurality of programmable logic elements, the programmable logic elements with each other.

2. Description of the Prior Art

There is conventionally known a programmable logic device (hereinafter simply referred to as a PLD), that is an integrated circuit with which a user can construct an arbitrary logic circuit manually.

The prior PLD primarily includes a programmable logic element (hereinafter simply referred to as a PLE) which is configurable to construct a user's own logic, a circuit function-defining memory cell for defining the logic function of the PLE and an interconnection relation among internal wirings, a programmable input/output block (hereinafter simply referred to as an IOB) for interfacing between external device packaging pins and an internal logic circuit (i.e., the PLE), and programmable wiring for establishing a wiring path to connect input/output signals into/from the IOB and the PLE to a desired network.

The programmable wiring is hitherto comprised, as illustrated for example in FIG. 9, of horizontal wirings 12 disposed between adjacent lines of the respective PLEs 10 (and IOBs), vertical wirings 14 disposed between adjacent columns of the respective PLEs 10 (and IOBs), switching matrixes 16 including interwiring switches 16A each disposed at intersections of the lines and the columns of the respective horizontal and vertical wirings 12 and 14 for interconnecting the wirings from the adjacent columns and lines, and input/output switches (hereinafter referred to as IOSs) 18 each disposed at a position corresponding to the adjacent PLEs 10 of the respective wirings 12 and 14 for connecting inputs and outputs into and from the adjacent PLEs 10 to the wirings 12 or 14.

The interwiring switches 16A and IOS 18 are controllable by each bit of circuit function-defining data, respectively, for establishing arbitrary wiring.

However, since in such a prior PLD, the IOSs 18 of the respective PLEs 10 and the interwiring switches 16A are independently provided, interconnection between two PLEs 10 always requires two IOSs 18 and at least one switching matrix 18, whether the two PLEs are disposed far away from or adjacent to each other. This arrangement further requires an increased number of the switches and complicated wiring, resulting in the PLD occupying a large area. Additionally, there are required many gates or switches, through which associated signals pass, thereby attenuating the signals and lowering the reliability of the device.

SUMMARY OF THE INVENTION

In view of the drawbacks of the prior art, it is an object of the present invention to provide a PLD with optimal programmable wiring that is highly versatile and occupies a reduced area.

In accordance with the present invention, there is provided a PLD including a plurality of programmable logic elements connected to each other through a programmable wiring, said programmable wiring comprising a plurality of switch stations each having a plurality of input/output terminals and each including therein switch elements for interconnecting said input/output terminals, first wirings each for directly connecting some terminals among said input/output terminals of said switch stations to input/output terminals of said adjacent logic elements, and second wirings each for directly connecting some terminals among said input/output terminals of said switch stations to the input/output terminals of the adjacent switch stations.

The present inventors have found in their investigation of many design examples that most part (over 60%) of the wirings among the PLEs interconnect the adjacent PLEs.

The present invention, which is based upon such investigations, facilitates interconnection between the adjacent PLEs to achieve its high function and its reduced occupation area.

In a primary aspect of the present invention, as illustrated in FIG. 1, the aforementioned programmable wiring comprises a plurality of switch stations (hereinafter simply referrd to as SSs) 20, first wiring 22 located diagonally in the figure each for directly connecting some terminals among the input/output terminals of the SSs 20 to the adjacent PLEs 10, and second wirings 24 located vertically and horizontally in the figure for directly connecting some terminals among the input/output terminals of the SSs 20 to the adjacent SSs. Here, the PLE 10 may include the input/output terminals: A, Din, B, C, RD, W, Y, K, D, Z, CE and X, as illustrated in FIG. 2 for example. Likewise, the SS 20 may include the input/output terminals: Y, K, D, W1-W4, Z, CE, X, S1-S4, A, Din, B, E1-E4, W, RD, C and N1-N4, as illustrated in FIG. 3 for example.

The programmable wiring of the present invention, as illustrated in FIG. 4, permits the number of the switches, through which an associated signal passes, to be reduced by a fraction corresponding to the prior IOSs. In particular, the adjacent two PLEs 10 can be interconnected through the only one SS 20.

Additionally, since the direction of a wiring connected to the SS 20, through which an associated signal is transmitted, can be clarified to make clear a relationship between the input and output of the SS 20, there is no need for unnecessarily switching among the outputs of the SS 20, differing from the prior case. Thus, any wiring path, which is not in need of connection, can be eliminated, thereby optimizing the circuit to, in this respect, reduce the number of the switches.

Furthermore, if there are any equivalent PLE inputs/outputs, then they can be taken into consideration clearly, so that flexibility of the wiring is less reduced even when a circuit construction is adopted with a reduced number of the switches and with many restrictions.

In accordance with the present invention, as described above, there is no need to provide an IOS as in the prior case and hence the number of the switches can be reduced, thereby allowing any wiring to be reduced, resulting in a high function. In particular, wiring between adjacent PLEs can be overwhelmingly simplified. In addition, the reduction of the number of the switches can realize the reduced occupation area of the device.

More specifically, if the direction of wiring would be changed between the first and second wirings, it might facilitate the discrimination therebetween.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein:

FIG. 7 is a block diagram exemplarily illustrating a switch table of a switch station for use in the embodiment of FIG. 5;

DESCRIPTION OF THE BEST MODES

In what follows, a preferred embodiment according to the present invention will be described in detail with reference to the accompanying drawings.

Figure 1:
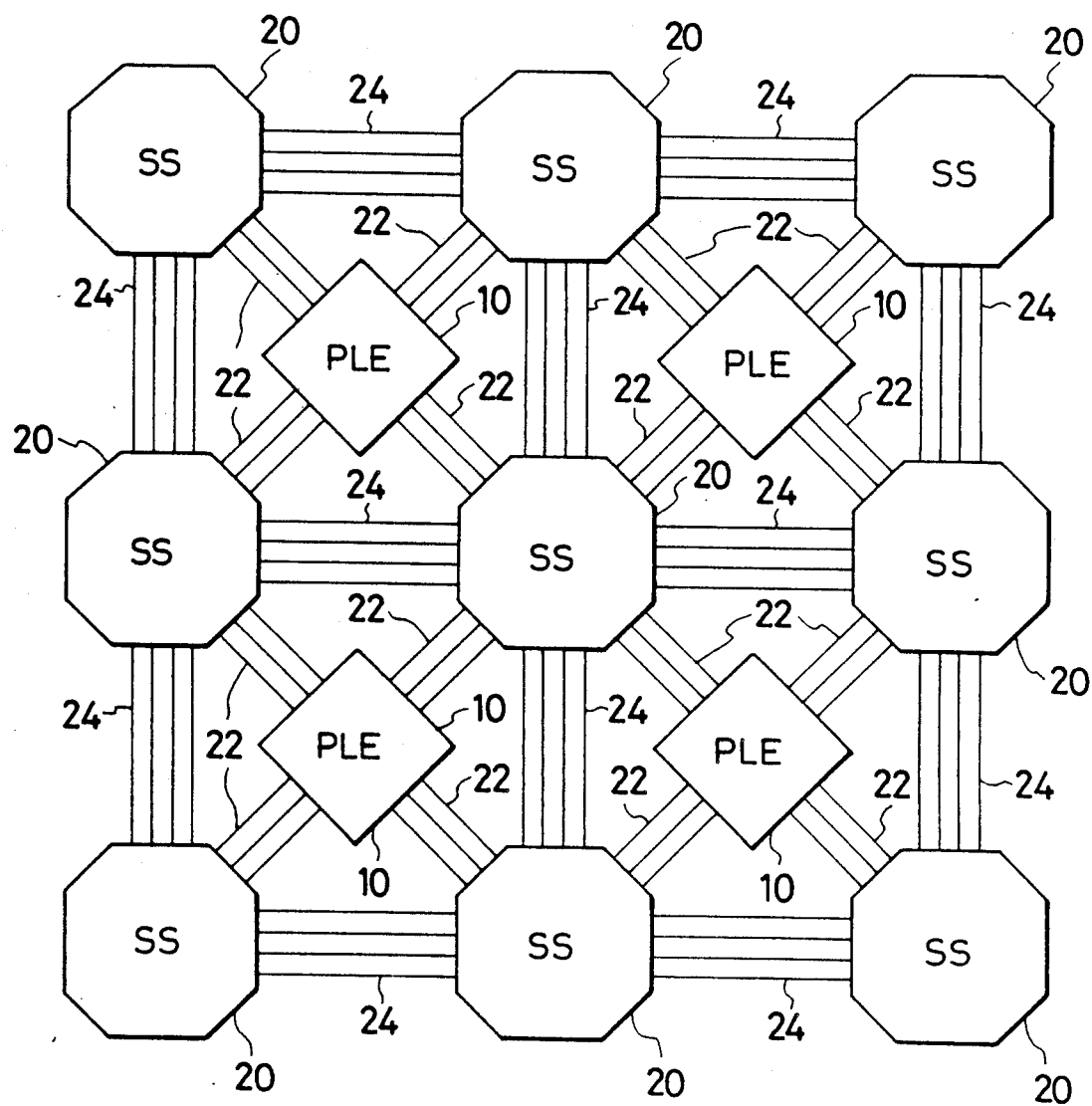
FIG. 1 is a block diagram illustrating the basic arrangement of a programmable logic device (PLD) according to the present invention.
Figure 2:
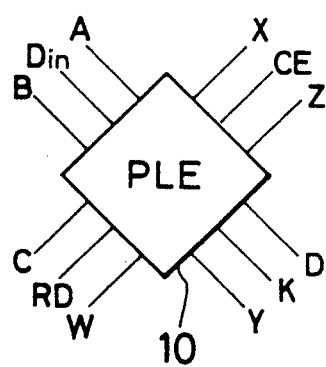
FIG. 2 is a block diagram exemplarily illustrating input/output terminals of a programmable logic element (PLE) for use in the PLD of FIG. 1.
Figure 3:
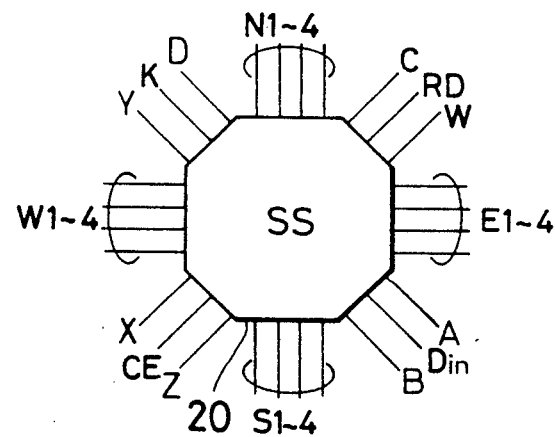
FIG. 3 is a block diagram exemplarily illustrating input/output terminals of a switch station (SS) for use in the PLD of FIG. 1.
Figure 4:
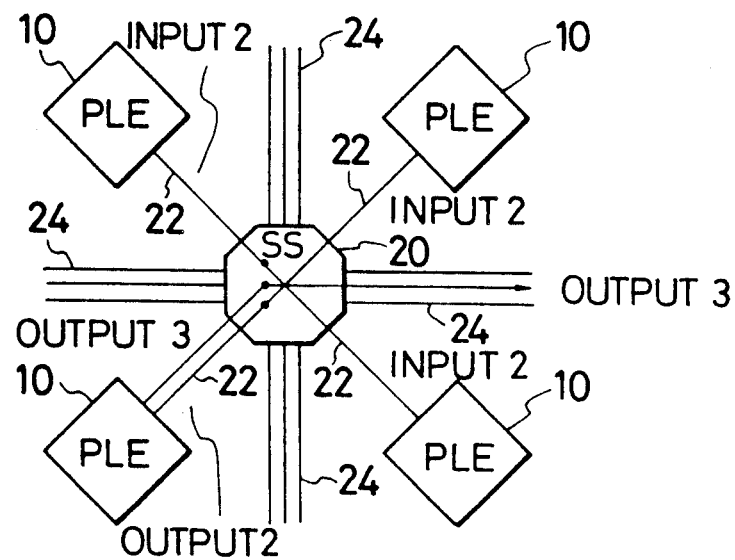
FIG. 4 is a block diagram illustrating the function of the PLD according to the present invention.
Figure 5:
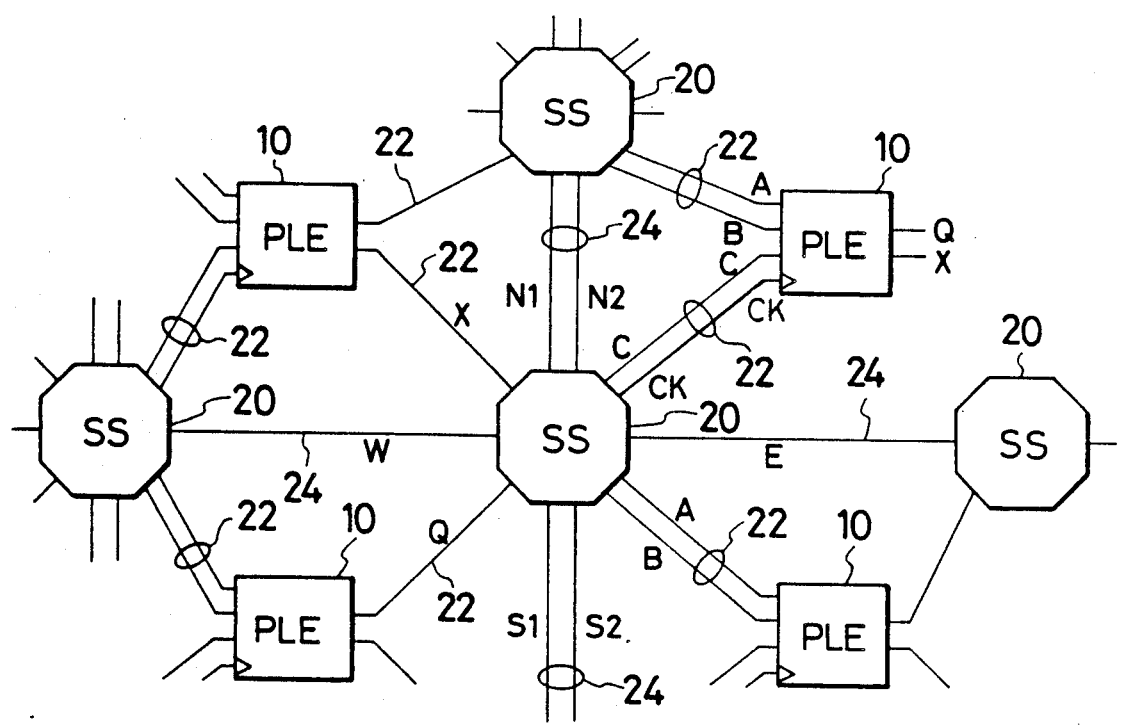
FIG. 5 is a block diagram illustrating the construction of an embodiment of the PLD according to the present invention.
Figure 8:
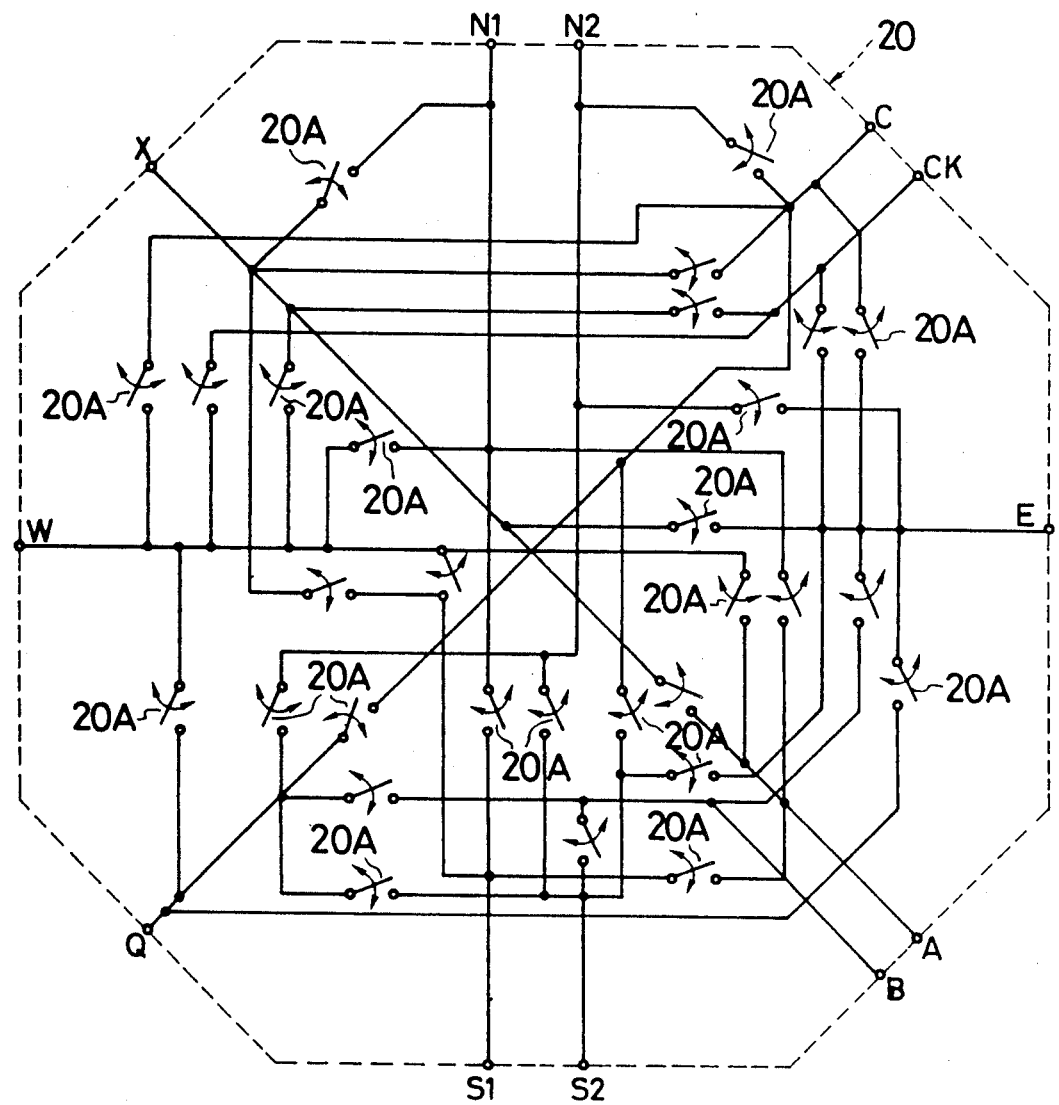
FIG. 8 is a circuit diagram exemplarily illustrating a circuit of the switch station constructed on the basis of the switch table of FIG. 7.
Figure 9:
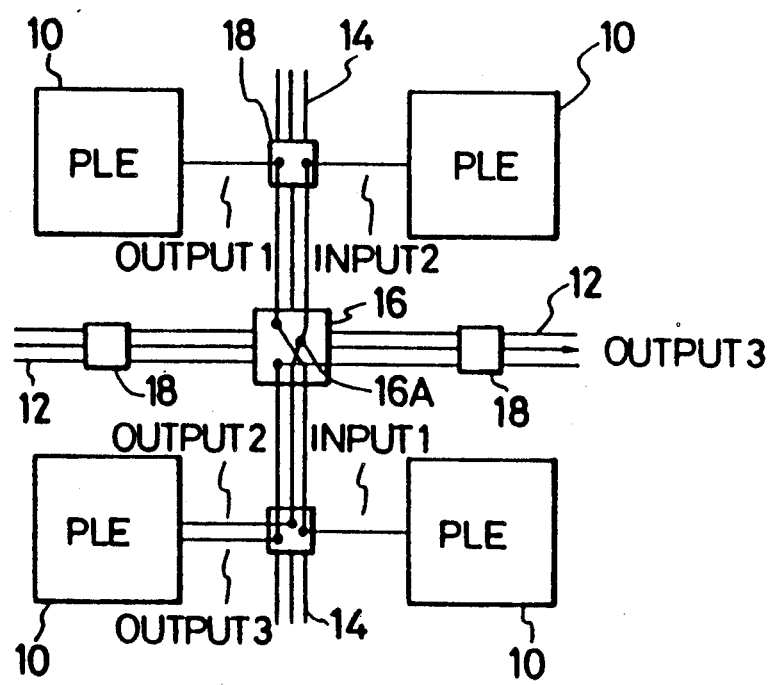
FIG. 9 is a block diagram exemplarily illustrating a prior PLD including a prior programmable wiring.

As shown in FIG. 5, the embodiment provides a PLD which includes a plurality of PLEs 10 connected to each other through a programmable wiring. The programmable wiring comprises a plurality of SSs 20, each of which has a plurality of input/output terminals, X, W, Q, S1, S2, B, A, E, CK, C, N1 and N2 and includes a switch 20A as shown in FIG. 8, for interconnecting the input/output terminals to each other; first wirings 22 located diagonally in the figure for directly connecting some terminals X, Q, B, A, CK and C of the input-/output terminals of the SS 20 to the adjacent PLEs 10; and second wirings 24 located horizontally and vertically in the figure for directly connecting remaining terminals W, S1, S2, E, N1 and N2 of the input/output terminals of the SS 20 to the adjacent SSs 20.

Figure 6:
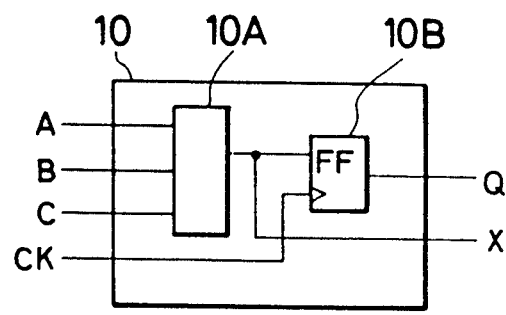
FIG. 6 is a block diagram illustrating the construction of a PLE for use in the PLD embodiment of FIG. 5.

The PLE 10 may be a sequential circuit, which includes, as illustrated in FIG. 6, a combined logic circuit (e.g., an AND circuit) 10A, into which general purpose inputs A, B and C are inputted, and a flip-flop 10B for delaying a combined logic output X from the combined logic circuit 10A in response to a clock CK to generate an output Q.

The SS 20 may be one to realize a switch table, such, for example, as that illustrated in FIG. 7. The SS 20 which realizes such a switch table of FIG. 7, may be constructed, as illustrated in FIG. 8 for example, with many switch elements 20A.

In the present embodiment, an arbitrary sequential circuit can be assured by programming a function in each PLE 10, which is a sequential circuit, as well as wiring in the SS 20.

In accordance with the present embodiment, the first wirings 22 have a first type of general directional orientation (diagonal), and the second wirings 24 have a second type of general directional orientation (up-down and right-left directions) different from the first wirings 22, thereby facilitating the discrimination of any wiring among the wirings.

Although in the above embodiment the PLE 10 is a sequential circuit including the combined logic circuit 10A and the flip-flop 10B, the PLE 10 may be constructed without limitation thereto.

Additionally, the switch table, which can be realized by the SS 20, and the practice thereof are also not limited to the present embodiment.

Although a certain preferred embodiment has been shown and described, it should be understood that many changes and modifications may be made therein without departing from the scope of the appended claims.

What is claimed is:

1. A programmable logic device including a plurality of programmable logic elements connected to each other through a programmable wiring, said programmable wiring comprising:
   a plurality of switch stations each having a plurality of input/output terminals, each switch station including therein switch elements each for interconnecting said input/output terminals;
   first wirings each for exclusively and directly connecting some terminals among said input/output terminals of said switch stations to input/output terminals of adjacent logic elements such that a plurality of adjacent programmable logic elements are connectable through a single one of said switch stations; and
   second wirings each for exclusively and directly connecting some terminals among said input/output terminals of said switch stations to the input/output terminals of adjacent switch stations.

2. A programmable logic device according to claim 1 wherein said first wirings and said second wirings have directional orientations different from each other.

3. A programmable logic device according to claim 1 wherein said switch station comprises a plurality of switch elements for implementing a predetermined switch table.

4. A programmable logic device according to claim 1 wherein said programmable logic element is a sequential circuit which comprises a combined logic circuit, into which any general purpose input is inputted, and a flip-flop for delaying a combined logical output from said combined logic circuit in response to a clock signal to generate a delayed output.

5. A programmable logic device including a plurality of programmable logic elements connected to each other through a programmable wiring, said programmable wiring comprising:
   a plurality of programmable logic elements, each of said programmable logic elements forming a sequential circuit comprising:
      a combined logic circuit into which any general purpose input is inputted;

a flip-flop for delaying a combined logical output from said combined logic circuit in response to a clock signal to generate a delayed output;

a plurality of switch stations each having a plurality of input/output terminals, each switch station including therein switch elements each for interconnecting said input/output terminals;

first wirings each for exclusively and directly connecting some terminals among said input/output terminals of said switch stations to input/output terminals of adjacent logic elements; and second wirings each for exclusively and directly connecting some terminals among said input/output terminals of said switch stations to the input/output terminals of adjacent switch stations.

* * * * *